US008488386B2

(12) United States Patent
Kim et al.

(10) Patent No.: US 8,488,386 B2
(45) Date of Patent: Jul. 16, 2013

(54) NONVOLATILE MEMORY DEVICE FOR REDUCING INTERFERENCE BETWEEN WORD LINES AND OPERATION METHOD THEREOF

(75) Inventors: Sung-Hoon Kim, Yongin-si (KR); Jai-Hyuk Song, Seongnam-si (KR); Yong-Joon Choi, Suwon-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 328 days.

(21) Appl. No.: 13/044,683

(22) Filed: Mar. 10, 2011

(65) Prior Publication Data
US 2011/0222339 A1 Sep. 15, 2011

(30) Foreign Application Priority Data

Mar. 11, 2010 (KR) .................. 10-2010-0021899

(51) Int. Cl.
*G11C 11/34* (2006.01)
(52) U.S. Cl.
USPC .................. 365/185.2; 365/185.18; 365/210.1
(58) Field of Classification Search
USPC .............................. 365/185.2, 185.18, 210.1
See application file for complete search history.

(56) References Cited

U.S. PATENT DOCUMENTS

| 7,310,280 | B2 | 12/2007 | Park et al. |
| 7,489,547 | B2 * | 2/2009 | Moogat et al. ........... 365/185.17 |
| 7,489,548 | B2 * | 2/2009 | Moogat et al. ........... 365/185.17 |
| 7,561,468 | B2 | 7/2009 | Hosono |
| 7,652,926 | B2 * | 1/2010 | Kang et al. ................. 365/185.2 |
| 7,652,931 | B2 * | 1/2010 | Park et al. ................ 365/185.29 |
| 2009/0003067 | A1 | 1/2009 | Kang et al. |

FOREIGN PATENT DOCUMENTS

| JP | 2006-186359 | 7/2006 |
| JP | 2008-077702 | 4/2008 |
| JP | 2009-009691 | 1/2009 |
| KR | 10-2006-0060528 | 6/2006 |
| KR | 10-2008-0026051 A | 3/2008 |
| KR | 10-2008-0114251 A | 12/2008 |

\* cited by examiner

*Primary Examiner* — Son Dinh
(74) *Attorney, Agent, or Firm* — Muir Patent Consulting, PLLC

(57) ABSTRACT

Provided are a nonvolatile memory device and a method of operating the same. The nonvolatile memory device in accordance with an embodiment of the inventive concept may include a string select line; a ground select line; a dummy word line adjacent to the ground select line; a first word line adjacent to the dummy word line; and a second word line disposed between the string select line and the first word line. The nonvolatile memory device is configured to apply a voltage to the dummy word line. When programming a memory cell connected to the first word line, a first dummy word line voltage lower than a voltage applied to the second word line is applied to the dummy word line. When programming a memory cell connected to the second word line, a second dummy word line voltage between a voltage applied to the first word line and the first dummy word line voltage is applied to the dummy word line. Accordingly, when a program operation is performed, a charge loss of a memory cell connected to a word line adjacent to a dummy word line can be reduced by changing a voltage applied to the dummy word line according to a select word line.

20 Claims, 12 Drawing Sheets

Fig. 4

|     | WL1 Select | WL2 Select | WL3 Select | WL4 Select | · · · | WLn Select |
|-----|------------|------------|------------|------------|-------|------------|
| WLn | Vpass | Vpass | Vpass | Vpass | · · · | Vpgm |
| ⋮ | ⋮ | ⋮ | ⋮ | ⋮ | ⋮ | ⋮ |
| WL4 | Vpass | Vpass | Vpass | Vpgm | · · · | Vpass |
| WL3 | Vpass | Vpass | Vpgm | Vpass | · · · | Vpass |
| WL2 | Vpass | Vpgm | Vpass | Vpass | · · · | Vpass |
| WL1 | Vpgm | Vpass | Vpass | Vpass | · · · | Vpass |
| DWL | VD1 | VD2 | VD2 | VD2 | · · · | VD2 |

(VD1 < VD2 < Vpass < Vpgm)

Fig. 5

|       | WL1 Select | WL2 Select | WL3 Select | WL4 Select | · · · | WLn Select |
|-------|------------|------------|------------|------------|-------|------------|
| WLn   | Vpass      | Vpass      | Vpass      | Vpass      | · · · | Vpgm       |
| ⋮     | ⋮          | ⋮          | ⋮          | ⋮          | ⋮     | ⋮          |
| WL4   | Vpass      | Vpass      | Vpass      | Vpgm       | · · · | Vpass      |
| WL3   | Vpass      | Vpass      | Vpgm       | Vpass      | · · · | Vpass      |
| WL2   | Vpass      | Vpgm       | Vpass      | Vpass      | · · · | Vpass      |
| WL1   | Vpgm       | Vpass      | Vpass      | Vpass      | · · · | Vpass      |
| DWL   | VD1        | VD2        | VD3        | VD4        | · · · | VDn        |

(VD1 < VD2 ≤ · · · ≤ VDn < Vpass < Vpgm)

NONVOLATILE MEMORY DEVICE FOR REDUCING INTERFERENCE BETWEEN WORD LINES AND OPERATION METHOD THEREOF

CROSS-REFERENCE TO RELATED APPLICATIONS

This U.S. non-provisional patent application claims priority under 35 U.S.C. §119 to Korean Patent Application No. 10-2010-0021899, filed on Mar. 11, 2010, the entire contents of which are hereby incorporated by reference.

BACKGROUND

The inventive concept described herein relates to memory devices, and more particularly, to a nonvolatile memory device and an operation method thereof.

Semiconductor memory devices are memory devices realized using a semiconductor such as silicon (Si), germanium (Ge), gallium arsenide (GaAs), indium phosphide (InP) and so on. Semiconductor memory devices are classified into volatile memory devices and nonvolatile memory devices.

Volatile memory devices lose their stored data when their power supplies are interrupted. Volatile memory devices include a static RAM (SRAM), a dynamic RAM (DRAM), a synchronous DRAM (SDRAM) or the like. Nonvolatile memory devices maintain their stored data even when their power supplies are interrupted. Nonvolatile memory devices include a read only memory (ROM), a programmable ROM (PROM), an erasable programmable ROM (EPROM), an electrically erasable programmable ROM (EEPROM), a flash memory device, a phase change RAM (PRAM), a magnetic RAM (MRAM), a resistive RAM (RRAM), a ferroelectric RAM (FRAM), and so on. A flash memory is classified into a NOR-type and a NAND-type.

As the integration of flash memory devices increases, a space between word lines is becoming narrow. As a result, an incorrect operation due to a coupling between word lines may occur. To reduce this coupling effect, a memory cell array of flash memory may include a dummy word line to widen a space between word lines. However, existing flash memory systems that include dummy word lines may still exhibit undesired coupling between the dummy word lines and actual word lines.

SUMMARY

Embodiments of the inventive concept provide a nonvolatile memory device. The nonvolatile memory device may include a string select line; a ground select line; a dummy word line adjacent to the ground select line; a first word line adjacent to the dummy word line; and a second word line disposed between the string select line and the first word line. The nonvolatile memory device is configured to apply a voltage to the dummy word line. When programming a memory cell connected to the first word line, a first dummy word line voltage lower than a voltage applied to the second word line is applied to the dummy word line. When programming a memory cell connected to the second word line, a second dummy word line voltage between a voltage applied to the first word line and the first dummy word line voltage is applied to the dummy word line.

In another embodiment, a nonvolatile memory device is disclosed. The nonvolatile memory device includes a memory cell array including at least a ground select line and a series of consecutive word lines. The series of consecutive word lines includes a dummy word line closest to the ground select line, and first through nth word lines successively further from the ground select line, the first through nth word lines including at least a first through fourth word line. The nonvolatile memory device is configured to apply a voltage to the dummy word line that depends on which of the first through nth word lines are selected. When the first word line is selected, a first dummy word line voltage lower than a voltage applied to the second word line is applied to the dummy word line, and when the second word line is selected, a second dummy word line voltage between a voltage applied to the first word line and the first dummy word line voltage is applied to the dummy word line.

In another embodiment, a method of operating a nonvolatile memory device is disclosed. The method includes determining whether or not a first word line adjacent a dummy word line is selected for a program operation; applying to the dummy word line, if the first word line is selected, a first dummy word line voltage lower than a pass voltage; and applying to the dummy word line, if a second word line not adjacent to the dummy word line is selected for a program operation, a second dummy word line voltage between the pass voltage and the first dummy word line voltage.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures:

FIG. 4 is a table representing dummy word lines in accordance with a selected word line when a program operation in accordance with an exemplary embodiment of the inventive concept is performed.

FIG. 5 is a table representing dummy word lines in accordance with a selected word line when a program operation in accordance with another exemplary embodiment of the inventive concept is performed.

DETAILED DESCRIPTION

Embodiments of the inventive concept will be described below in more detail with reference to the accompanying drawings. The embodiments of the inventive concept may, however, be embodied in different forms and should not be constructed as limited to the embodiments set forth herein. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
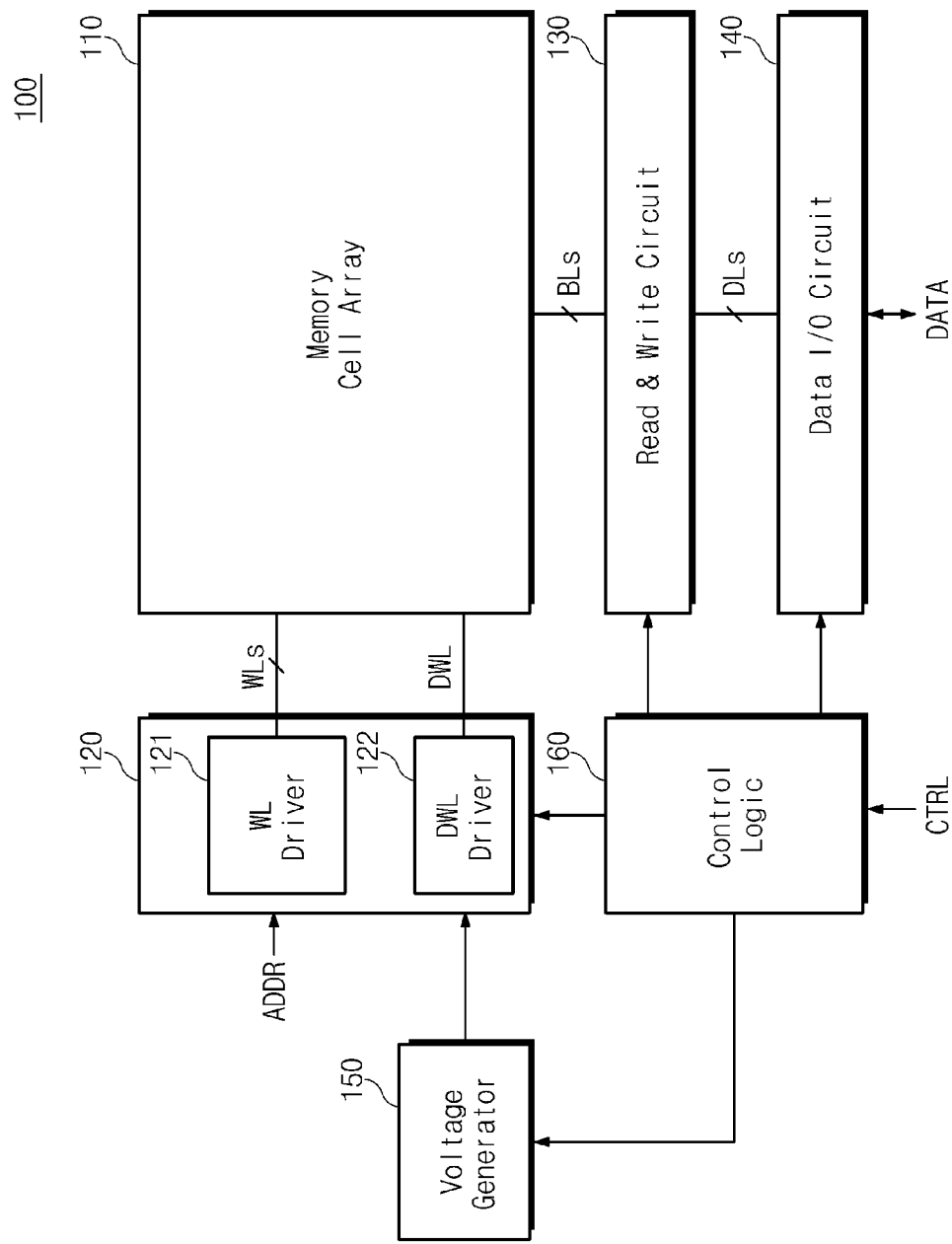
FIG. 1 is a block diagram illustrating an exemplary flash memory device in accordance with an embodiment of the inventive concept.

FIG. 1 is a block diagram illustrating an exemplary flash memory device in accordance with an embodiment of the inventive concept. Referring to FIG. 1, a flash memory device 100 includes a memory cell array 110, an address decoder 120, a read/write circuit 130, a data input/output circuit 140, a voltage generator 150 and a control logic circuit 160.

The memory cell array 110 is connected to the address decoder 120 through word lines WLs and dummy word lines DWL and is connected to the read/write circuit 130 through bit lines BLs. The memory cell array 110 includes a plurality of memory cells arranged in a matrix shape. Data is read from and written to a memory cell corresponding to a word line selected by the address decoder 120 and a bit line selected by the read/write circuit 130.

The address decoder 120 operates in response to a control of the control logic circuit 160. The address decoder 120 includes a word line driver 121 and a dummy word line driver 122. The address decoder 120 also includes well known constituent elements, like an address buffer, a row address decoder and a column address decoder (not shown). The address decoder 120 receives an address ADDR from outside the address decoder 120. The address decoder 120 decodes a row address and a column address among addresses ADDR provided from the outside. In one embodiment, the address decoder 120 selects word lines WLs and a dummy word line DWL according to the decoded row address. The address decoder 120 provides the decoded column address to the read/write circuit 130 (connection not shown).

The word line driver 121 transfers word line voltages such as a program voltage Vpgm and a pass voltage Vpass provided from the voltage generator 150 to corresponding word lines. The dummy word line driver 122 transfers dummy word line voltages provided from the voltage generator 150 to the dummy word line DWL.

The read/write circuit 130 is connected to the memory cell array 110 through bit lines BLs and is connected to the data input/output circuit 140 through data lines DLs. The read/write circuit 130 may include well known constituent elements, like a sense amplifier, a page buffer and a column select circuit (not shown). The read/write circuit 130 operates in response to a control of the control logic circuit 160. In one embodiment, the read/write circuit 130 selects bit lines BLs according to the decoded column address transferred from the address decoder 120.

As an illustration, the read/write circuit 130 writes data received from the data input/output circuit 140 through the data lines DLs in the memory cell array 110. Also, the read/write circuit 130 transfers data read from the memory cell array 110 to the data input/output circuit 140 through the data lines DLs. In another example, the read/write circuit 130 writes data read from a first storage region of the memory cell array 110 in a second storage region of the memory cell array 110 (copy-back operation).

The data input/output circuit 140 is connected to the read/write circuit 130 through the data lines DLs. The data input/output circuit 140 may include well known constituent elements, like a data buffer (not shown). The data input/output circuit 140 provides data received from the outside (e.g., outside the memory device) to the read/write circuit 130. The data input/output circuit 140 transfers data received from the read/write circuit 130 to the outside. The data input/output circuit 140 operates in response to a control of the control logic circuit 160.

The voltage generator 150 provides word line voltages such as a program voltage Vpgm and a pass voltage Vpass to the word line driver 121. In one embodiment, the voltage generator 150 also provides dummy word line voltages having different voltage levels from one another to the dummy word line driver 122. The voltage generator 150 operates in response to a control of the control logic circuit 160.

In one embodiment, the control logic circuit 160 is connected to the address decoder 120, the read/write circuit 130, the data input/output circuit 140 and the voltage generator 150. The control logic circuit 160 controls important certain of the flash memory device 100. The control logic circuit 160 operates in response to a control signal CTRL received from the outside (e.g., outside the memory device).

The flash memory device 100 in accordance with an embodiment of the inventive concept changes a voltage applied to the dummy word line DWL according to a selected word line when a program operation is performed. As an illustration, in one embodiment, if a word line immediately adjacent to the dummy word line DWL is selected, the flash memory device 100 applies a first dummy word line voltage having a level lower than the pass voltage Vpass to the dummy word line DWL. In addition, if a word line immediately adjacent to the dummy word line DWL is not selected (e.g., a different word line not immediately adjacent to the dummy word line DWL is selected), the flash memory device 100 applies a second dummy word line voltage having a level between the first dummy word line voltage and the pass voltage Vpass to the dummy word line DWL.

Figure 2:
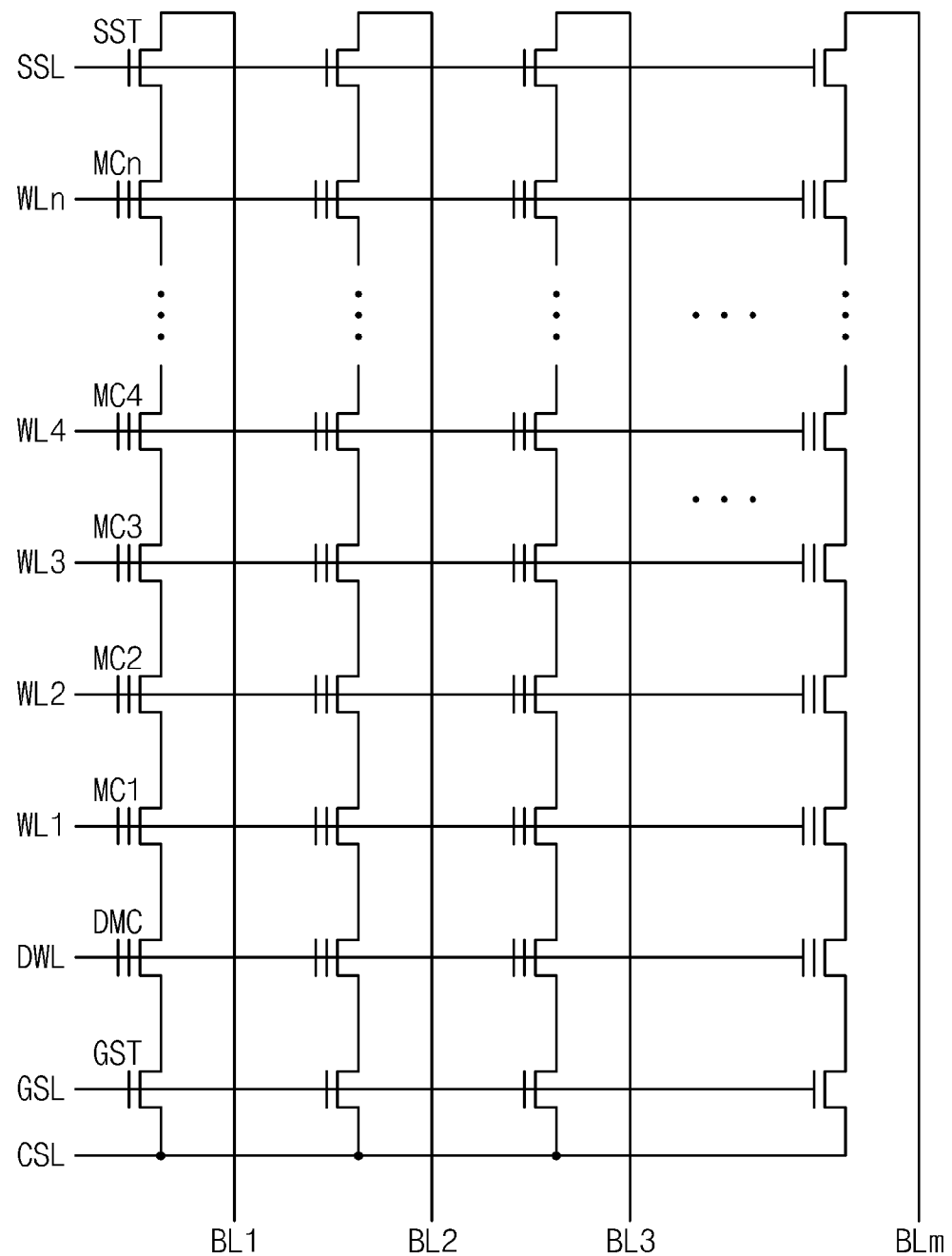
FIG. 2 is a circuit diagram illustrating an exemplary memory cell array of flash memory device in accordance with an embodiment of the inventive concept.

FIG. 2 is a circuit diagram illustrating an exemplary memory cell array of a flash memory device in accordance with an embodiment of the inventive concept. As an example, one memory block among a plurality of memory blocks of the memory cell array 110 is illustrated. In the example of FIG. 2, the memory cell array 110 has a NAND-type memory cell array structure.

Referring to FIG. 2, the memory cell array 110 includes a plurality of strings. Each string is comprised of a string select transistor SST, a ground select transistor GST, a plurality of memory cells MC1-MCn and a dummy cell DMC. In one embodiment, the dummy cell DMC is adjacent to the ground select transistor GST and is connected to the ground select transistor GST. The plurality of memory cells MC1-MCn are connected to one another between the string select transistor SST and the dummy cell DMC.

Drain/sources of the string select transistors SST are connected to corresponding bit lines BL1-BLm. Gates of the string select transistors SST are connected to a string select line SSL. Source/drains of the ground select transistors GST are connected to common source line CSL. Gates of the ground select transistors GST are connected to a ground select line GSL. Gates of the memory cells MC1-MCn are connected to corresponding word lines WL1-WLn. Gates of the dummy cells DMC are connected to a dummy word line DWL.

As the integration of nonvolatile memory devices increases, a space between word lines is becoming narrow. As a result, an incorrect operation due to a coupling between word lines may occur. As a voltage level difference between voltages applied to word lines adjacent to each other becomes higher, the incorrect operation due to a coupling between word lines may increase. Thus, it is helpful to ease a coupling between adjacent word lines for the sake of a stable operation of nonvolatile memory device.

For example, the dummy word line DWL performs a function of easing a coupling between a ground select line GSL and a word line adjacent the ground select line GSL by widening a space between the ground select line GSL and the adjacent word line. However, if the pass voltage Vpass is applied to the dummy word line DWL, in a similar manner as unselected word lines when a program operation is performed, the dummy cell may inadvertently be programmed due to a level difference between the pass voltage Vpass and a voltage applied to the ground select line GSL. As a result, a threshold voltage of the dummy cell DMC may become high.

If a threshold voltage of the dummy cell DMC becomes high, a channel is not sufficiently formed and thereby a program speed may decrease or a program error may occur. Therefore, in one embodiment, a dummy word line voltage lower than the pass voltage Vpass is applied to the dummy word line DWL to prevent that phenomenon.

However, if a dummy word line voltage excessively lower than the pass voltage Vpass is applied to the dummy word line DWL, then a coupling between the dummy word line DWL and the first word line WL1 adjacent to the dummy word line DWL can be a problem.

For example, assume that when a program operation is performed, the pass voltage Vpass is applied to the first word line WL1 and the program voltage Vpgm is applied to the second word line WL2. Also, assume that a dummy word line voltage lower than the pass voltage Vpass is applied to the dummy word line DWL. At this time, a voltage applied to the first word line WL1 may be lower than the pass voltage Vpass due to a coupling between the dummy word line DWL and the first word line WL1. If when a program operation is performed, a voltage difference between the first and second word lines WL1 and WL2 is greater than a specific level, charge loss may occur at memory cells connected to the first word line WL1.

Assuming that the first memory cell MC1 connected to the first word line WL1 is already programmed, charges trapped in a charge storage layer of the first memory cell MC1 may be leaked to the outside due to an electric field between the first and second word lines WL1 and WL2. A threshold voltage of the first memory cell MC1 is thus lowered due to the charge loss and thereby data stored in the first memory cell MC1 may be changed.

Figure 3:
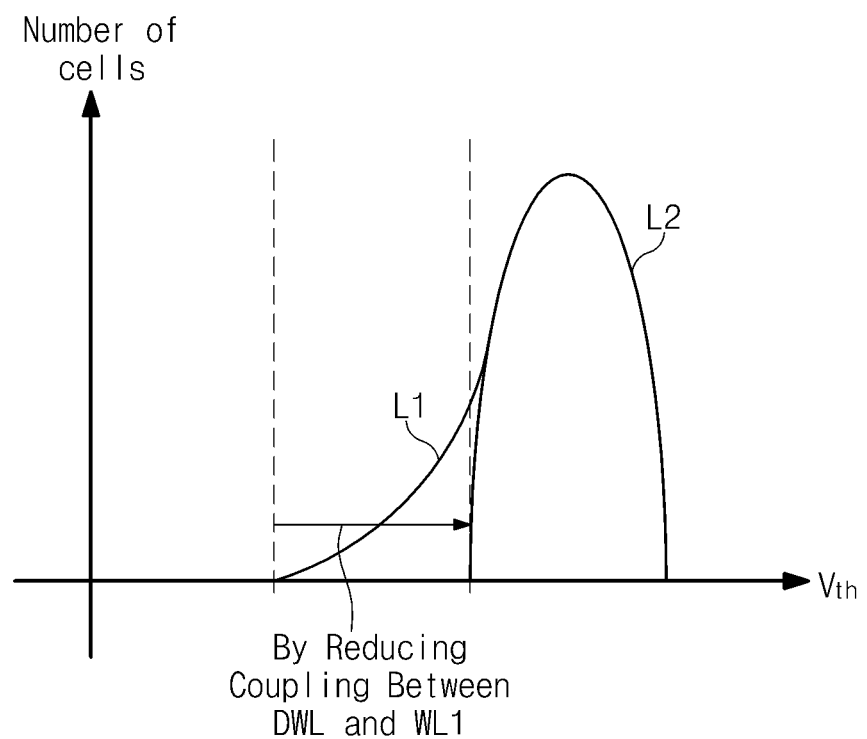
FIG. 3 is a graph showing an exemplary distribution of threshold voltages relative to programmed memory cells.

FIG. 3 is a graph showing an exemplary distribution of threshold voltages relative to programmed memory cells. Referring to FIG. 3, a first line L1 shows a distribution of threshold voltages relative to memory cells in the case that charge loss may occur at memory cells connected to the first word line WL1 due to a coupling between the dummy word line DWL and the first word line WL1 adjacent to the dummy word line DWL. A second line L2 shows a distribution of threshold voltages relative to memory cells in the case that charge loss does not occur at memory cells connected to the first word line WL1.

The distribution of threshold voltages represented by the first line L1 shows that the number of memory cells of which threshold voltages are lowered due to charge loss increases. The distribution of threshold voltages represented by the second line L2 has a symmetrical structure having a narrow width.

The flash memory device in accordance with an embodiment of the inventive concept controls a level of a voltage applied to the dummy word line DWL depending on a select word line so as to minimize a coupling between the dummy word line DWL and the first word line WL1 when a program operation is performed. Thus, even though a program operation is repeatedly performed, the distribution of threshold voltages represented by the second line L2 may be maintained. To set appropriate dummy word line voltages, the dummy word line voltages in accordance with a select word line can be determined through a repetitive experiment in order to maintain the distribution of threshold voltages represented by the second line L2.

For example, based on testing, a dummy word line voltage level can be selected so that when programming a memory cell connected to the first word line, to prevent a dummy cell connected to the dummy word line from being programmed, a difference between a ground voltage applied to the ground select line and the first dummy word line voltage is maintained below a reference level. In addition, based on additional testing, the dummy word line voltage level also be set so that when programming a memory cell connected to the second word line, to limit a reduction of a voltage of the first word line when a pass voltage is applied to the first word line, a difference between the pass voltage and the second dummy word line voltage is maintained below a reference level FIG. 4 is a table representing dummy word lines in accordance with a select word line when a program operation in accordance with an embodiment of the inventive concept is performed. Referring to FIG. 4, in one embodiment, if the first word line WL1 is selected, the word line driver 121 transfers the program voltage Vpgm to the first word line WL1 and transfers the pass voltage Vpass to the second through nth word lines WL2-WLn.

At the same time, the dummy word line driver 122 transfers a first dummy word line voltage VD1 to the dummy word line DWL. As described above, if the pass voltage Vpass is applied to the dummy word line DWL, the dummy cell DMC may be inadvertently programmed due to a level difference of a voltage applied to the ground select line GSL and the pass voltage Vpass. To prevent this, the dummy word line driver 122 transfers the first word line voltage VD1 lower than the pass voltage Vpass to the dummy word line DWL.

When the first word line WL1 is not selected, and one of the second through nth word lines WL2-WLn are selected, the word line driver 121 transfers the program voltage Vpgm to the selected word line and transfers the pass voltage Vpass to the unselected word lines. At the same time, the dummy word line driver 122 transfers a second dummy word line voltage VD2 to the dummy word line DWL.

In one embodiment, the second dummy word line voltage VD2 has a level between the first dummy word line voltage VD1 and the pass voltage Vpass (e.g., higher than VD1 but lower than Vpass) so that a coupling between the dummy word line DWL and the first word line WL1 is minimized. The second dummy word line voltage VD2 that best minimizes coupling may be determined through a repetitive experiment.

That is, when one of the second through nth word lines WL2-WLn is selected, the dummy word line driver 122 transfers the second dummy word line voltage VD2 between the first dummy word line voltage VD1 and the pass voltage Vpass to the dummy word line DWL.

According to the flash memory device in accordance with an embodiment of the inventive concept, when a program operation is performed, a coupling between the dummy word line and a word line adjacent to the dummy word line can be minimized by controlling a dummy word line voltage based on which word line is the selected word line. As a result, a charge loss occurring at memory cells connected to a word line adjacent to the dummy word line can be prevented. Thus, a distribution of threshold voltages relative to programmed memory cells can be uniformly maintained.

FIG. 5 is a table representing dummy word lines in accordance with a selected word line when a program operation in accordance with another exemplary embodiment of the inventive concept is performed. Referring to FIG. 5, when the first word line WL1 is selected, the word line driver 121 transfers the program voltage Vpgm to the first word line WL1 and transfers the pass voltage Vpass to the second through nth word lines WL2-WLn.

At the same time, the dummy word line driver 122 transfers the first word line voltage VD1 to the dummy word line DWL. If the pass voltage Vpass is applied to the dummy word line DWL, the dummy cell DMC may be inadvertently programmed due to a level difference of a voltage applied to the ground select line GSL and the pass voltage Vpass. Thus, to prevent this, the dummy word line driver 122 transfers the first dummy word line voltage VD1 lower than the pass voltage Vpass to the dummy word line DWL.

When the first word line WL1 is not selected, and one of the second through nth word lines WL2-WLn are selected, the word line driver 121 transfers the program voltage Vpgm to a selected word line and transfers the pass voltage Vpass to the unselected word lines. At the same time, the dummy word line driver 122 transfers one of second through nth dummy word line voltages VD2-VDn to the dummy word line DWL according to the second through nth word lines WL2-WLn being selected.

As a space between word lines in a memory cell array becomes smaller, a coupling not only between the dummy word line and the first word line WL1 adjacent to the dummy word line but also between the dummy word line and the second through nth word lines WL2-WLn may occur.

In one embodiment, the second through nth dummy word line voltages VD2-VDn have a level between the first dummy word line voltage VD1 and the pass voltage Vpass respectively so that a coupling between the dummy word line DWL and a plurality of word lines WL1-WLn is minimized. The second through nth dummy word line voltages VD2-VDn may be determined through a repetitive experiment. For example, after the first word line, as word lines successively further in the array from the dummy word line are selected, a voltage incrementally higher than the first dummy word line voltage VD1, but still lower than the pass voltage Vpass, may be applied to the dummy word line. As such, coupling between the dummy word line and the plurality of word lines can be minimized.

The second through nth dummy word line voltages VD2-VDn are not limited to have different levels from one another. For example, each of the third through nth dummy word line voltages VD3-VDn may be equal to or greater than the previous dummy word line voltages VD2-VDn-1. Under the above condition, the dummy word line voltages VD1-VDn in accordance with a select word line may be applied to the dummy word line DWL in various patterns.

According to the flash memory device in accordance with an embodiment of the inventive concept, a coupling between the dummy word line and word lines adjacent to the dummy word line can be minimized by controlling a dummy word line voltage level according to a selected word line when a program operation is performed. As a result, a charge loss occurring at memory cells connected to word lines adjacent to the dummy word line can be prevented. Thus, a distribution of threshold voltages relative to programmed memory cells can be uniformly maintained.

Figure 6:
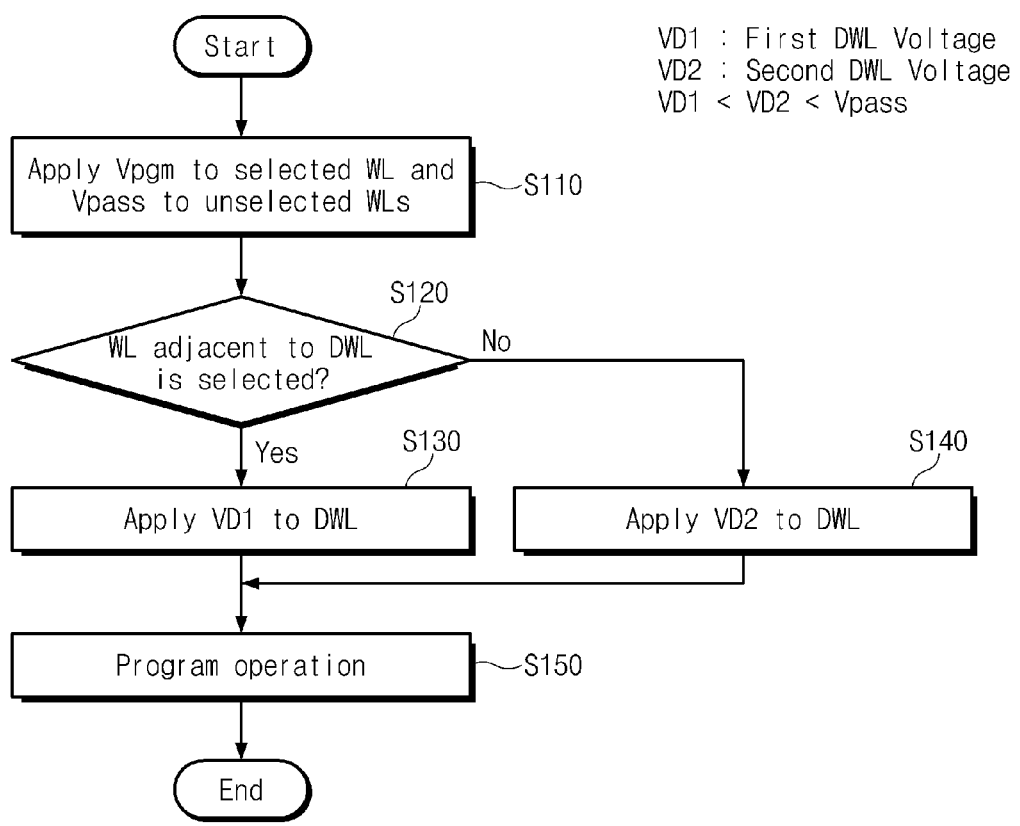
FIG. 6 is a flow chart for describing an exemplary operation method of a flash memory device in accordance with an embodiment of the inventive concept.

FIG. 6 is a flow chart for describing an exemplary operation method of a flash memory device in accordance with an embodiment of the inventive concept. Referring to FIG. 6, when a program operation is performed (e.g., to program memory cells connected to a selected word line), the word line driver 121 transfers the program voltage Vpgm to a selected word line and transfers the pass voltage Vpass to the unselected word lines in response to a control of the control logic circuit 160 (S110).

The control logic circuit 160 judges whether a word line adjacent to the dummy word line DWL is selected or not in order to determine a voltage to be applied to the dummy word line DWL (S120).

If a selected word line is immediately adjacent to the dummy word line DWL, the dummy word line driver 122 transfers the first dummy word line voltage VD1 lower than the pass voltage Vpass to the dummy word line DWL in response to a control of the control logic circuit (S130). This is to prevent the dummy cell from being programmed due to a difference of a level between a voltage applied to the ground select line GSL and the pass voltage Vpass.

If the selected word line is not immediately adjacent to the dummy word line DWL (i.e., there is at least one word line between the selected word line and the dummy word line DWL), the dummy word line driver 122 transfers a second dummy word line voltage VD2 having a voltage level between the first dummy word line voltage VD1 and the pass voltage Vpass (i.e., greater than VD1 and less than Vpass) to the dummy word line DWL in response to a control of the control logic circuit (S140). This is to ease a coupling between the dummy word line DWL and a word line adjacent to the dummy word line DWL.

Stated in other terms, the voltage applied to the dummy word line may be controlled based on the distance between a selected word line and the dummy word line. That is, when a first word line closer to dummy word line than a second word line is selected, a first voltage may be applied to the dummy word line that is lower than a second voltage applied to the dummy word line when the second word line is selected. For example, when a word line n rows away from a dummy word line is selected (when n=1, this means the immediately adjacent row), the voltage applied to the dummy word line may be lower than when a word line n+1 rows away from a dummy word line is selected. For any of these scenarios, in one embodiment, a program voltage Vpgm is applied to the selected word line and a pass voltage Vpass is applied to all of the unselected word lines. The pass voltage Vpass may be the same for all of the unselected word lines, and may be greater than the different voltages applied to the dummy word lines.

In step S150, the flash memory device 110 performs a program operation on the selected memory cells. For example, data may be stored on transistors in the selected row based on bit line voltages input on the bit lines.

According to the flash memory device in accordance with an embodiment of the inventive concept, when a program operation is performed, a coupling between the dummy word line and a word line adjacent to the dummy word line can be minimized by controlling a dummy word line voltage according to a selected word line. As a result, a charge loss occurring at memory cells connected to the word line adjacent to the dummy word line can be prevented. Thus, a distribution of threshold voltages of programmed memory cells can be uniformly maintained.

The flash memory device in accordance with embodiments of the inventive concept can be applied to various products. The flash memory device can be embodied by not only an electronic device such as a personal computer, a digital camera, a camcorder, a cell phone, MP3, PMP, PSP, PDA or the like, but also a storage device such as a memory card, a USB memory, a solid state drive (SSD) or the like.

Figure 7:
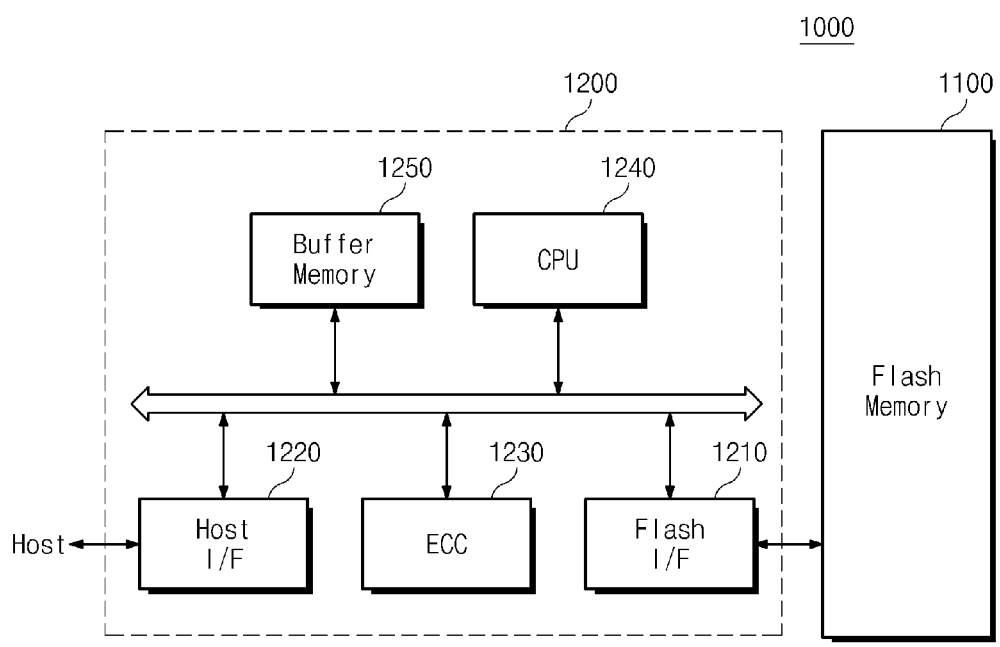
FIG. 7 is a block diagram illustrating an exemplary memory system using a flash memory device in accordance with an embodiment of the inventive concept.

FIG. 7 is a block diagram illustrating an exemplary memory system using a flash memory device in accordance with an embodiment of the inventive concept. Referring to FIG. 7, a memory system 1000 includes a flash memory device 1100 and a memory controller 1200.

The flash memory device 1100 and the memory controller 1200 can be included in one storage device. The storage device may include a mobile storage device such as a USB memory or a memory card (MMC, SD card, xD card, CF card, SIM card and so on). Also, the storage device can be used by being connected to a host such as a computer, a notebook, a digital camera, a cell phone, a MP3 player, PMP, a game machine or the like.

The flash memory device 1100 can perform erasure, writing, and read operations according to a control of the memory controller 1200. In accordance with the embodiments described above, the flash memory device 1100 may be configured to change a voltage applied to a dummy word line DWL according to a selected word line when a program operation is performed.

As an example, if a word line immediately adjacent to the dummy word line DWL is selected, the flash memory device 1100 may apply a first dummy word line voltage VD1 lower than a pass voltage Vpass to a dummy word line DWL. If, on the other hand, a word line immediately adjacent to the dummy word line is not selected, the flash memory device 1100 may apply a second dummy word line voltage VD2 having a voltage level between the first dummy word line voltage VD1 and the pass voltage Vpass to the dummy word line DWL.

The memory controller 1200 may include a flash interface 1210, a host interface 1220, an ECC circuit 1230, a central processing unit (CPU) 1240 and a buffer memory 1250.

The flash interface 1210 is used to exchange a command, an address, data or the like with the flash memory device 1100. That is, the flash interface 1210 provides a read command and an address when a read operation is performed and provides a writing command, an address and data when a writing operation is performed. The host interface 1220 is used to receive a request of writing or reading, or to provide data in response to a request of the host.

The ECC circuit 1230 generates a parity bit (or ECC data) by using data transferred to the flash memory device 1100. The generated parity bit is stored in a spare area of the flash memory device 1100. The ECC circuit 1230 detects an error of data read from the flash memory device 1100. If a detected error is in the range of correction, the ECC circuit 1230 corrects the detected error. The ECC circuit 1230 may be located inside or outside the memory controller 1200 according to the memory system 1000.

The central processing unit (CPU) 1240 is constituted to control a read operation or a writing operation of the flash memory device 1100 in response to a request of the host. The buffer memory 1250 can temporarily store data read from the flash memory device 1100 or data provided from the host. Also, the buffer memory 1250 may be used to drive a firmware such as a flash translation layer (FTL). The flash translation layer (FTL) is managed by the central processing unit (CPU) 1240. The buffer memory 1250 may be embodied by a DRAM, a SRAM or the like.

The buffer memory 1250 can store table information needed to manage read error information. The table information may be meta data stored in a meta area of the flash memory device 1100. The table information is copied to the buffer memory 1250 from the meta area when a power is up. Although not illustrated in the drawing, the memory system 1000 may further include a ROM storing code data for interfacing with the host.

Figure 8:
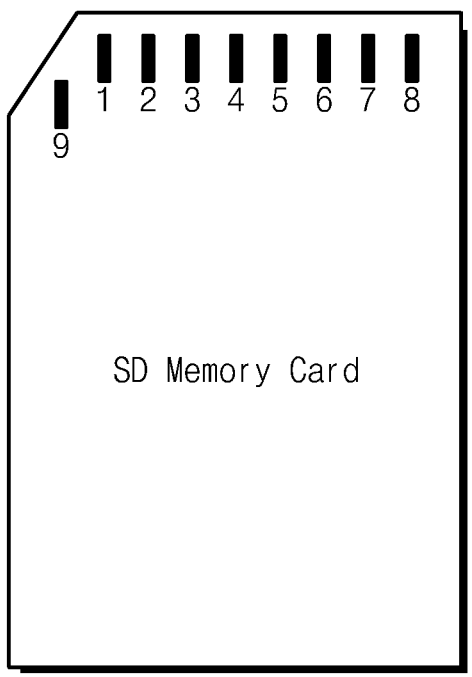
FIG. 8 is a block diagram illustrating an exemplary memory card including a flash memory device in accordance with an embodiment of the inventive concept.

FIG. 8 is a block diagram illustrating an exemplary memory card including a flash memory device in accordance with an embodiment of the inventive concept. FIG. 8 shows an appearance of SD card. Referring to FIG. 8, the SD card is comprised of nine pins. The SD card has four data pins (for example, 1, 7, 8, 9), one clock pin (for example, 5) and three power supply pins (for example, 3, 4, 6).

In the example of FIG. 8, a command and a response may be transferred through a command pin (pin 2). Generally, a command is transferred from a host to a memory card and a response is transferred from a memory card to a host.

The memory system 1000 in accordance with embodiments of the inventive concept can be embodied by a mobile storage device such as a SD card. The memory system 1000 may include a flash memory device 1100 and a memory controller 1200 for controlling the flash memory device 1100, as discussed above, for example, in connection with FIG. 7.

Figure 9:
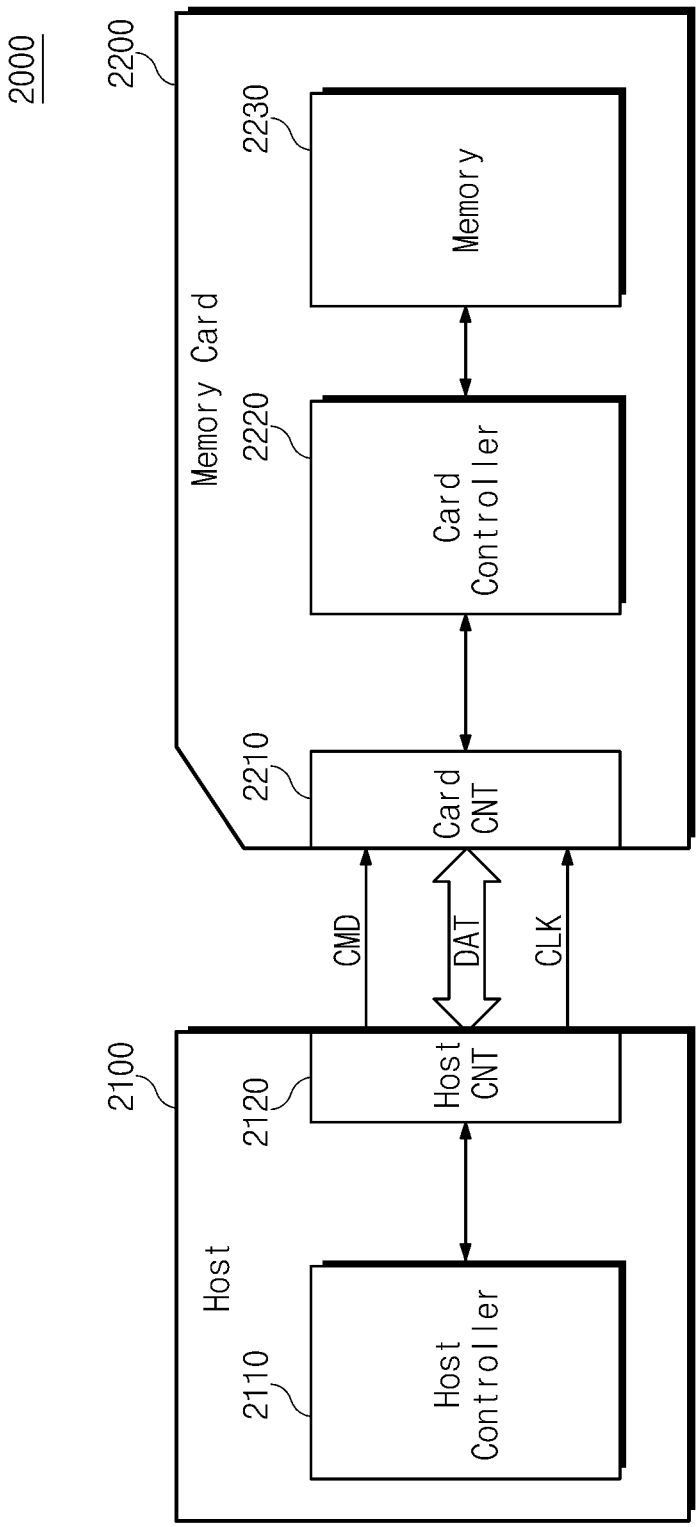
FIG. 9 is a block diagram illustrating an inner constitution of the memory card illustrated in FIG. 8 and a connection relation between the memory card and a host, in accordance with an exemplary embodiment.

FIG. 9 is a block diagram illustrating an exemplary inner constitution of the memory card illustrated in FIG. 8 and an exemplary connection relation between the memory card and a host. A memory card system 2000 includes a host 2100 and a memory card 2200. The host 2100 includes a host controller 2110 and a host connection unit 2120. The memory card 2200 includes a card connection unit 2210, a card controller 2220 and a memory 2230.

The host connection unit 2120 and the card connection unit 2210 are comprised of a plurality of pins. These pins include a command pin, a data pin, a clock pin and a power supply pin. The number of pins becomes different according to kind of the memory card 2200. As an illustration, a SD card has nine pins.

The host 2100 writes data in the memory card 2200 or reads data stored in the memory card 2200. The host controller 2110 transfers a command (for example, a writing command), a clock signal CLK generated from a clock generator (not shown) in the host 2100 and data to the memory card 2200 through the host connection unit 2120.

The card controller 2220 responds to a writing command received through the card connection unit 2210 to store data in the memory 2230 in synchronization with the clock signal CLK generated from a clock generator (not shown) in the host 2100. The memory 2230 stores data transferred from the host 2100. For example, in the case that the host 2100 is a digital camera, the memory 2230 stores image data.

The memory system 1000 of FIG. 7 can be embodied by the memory card system 2000 such as shown in FIG. 9. The memory system 1000 includes a flash memory device 1100 and a memory controller 1200. Here, the flash memory device 1100 may be embodied by the memory 2230 and the memory controller 1200 may be embodied by the card controller 2220.

The flash memory device 1100 can perform erasure, writing and read operations according to a control of the memory controller 1200. The flash memory device 1100 changes a voltage applied to a dummy word line DWL according to a select word line when a program operation is performed, as described above, for example, in connection with FIGS. 4-6.

Figure 10:
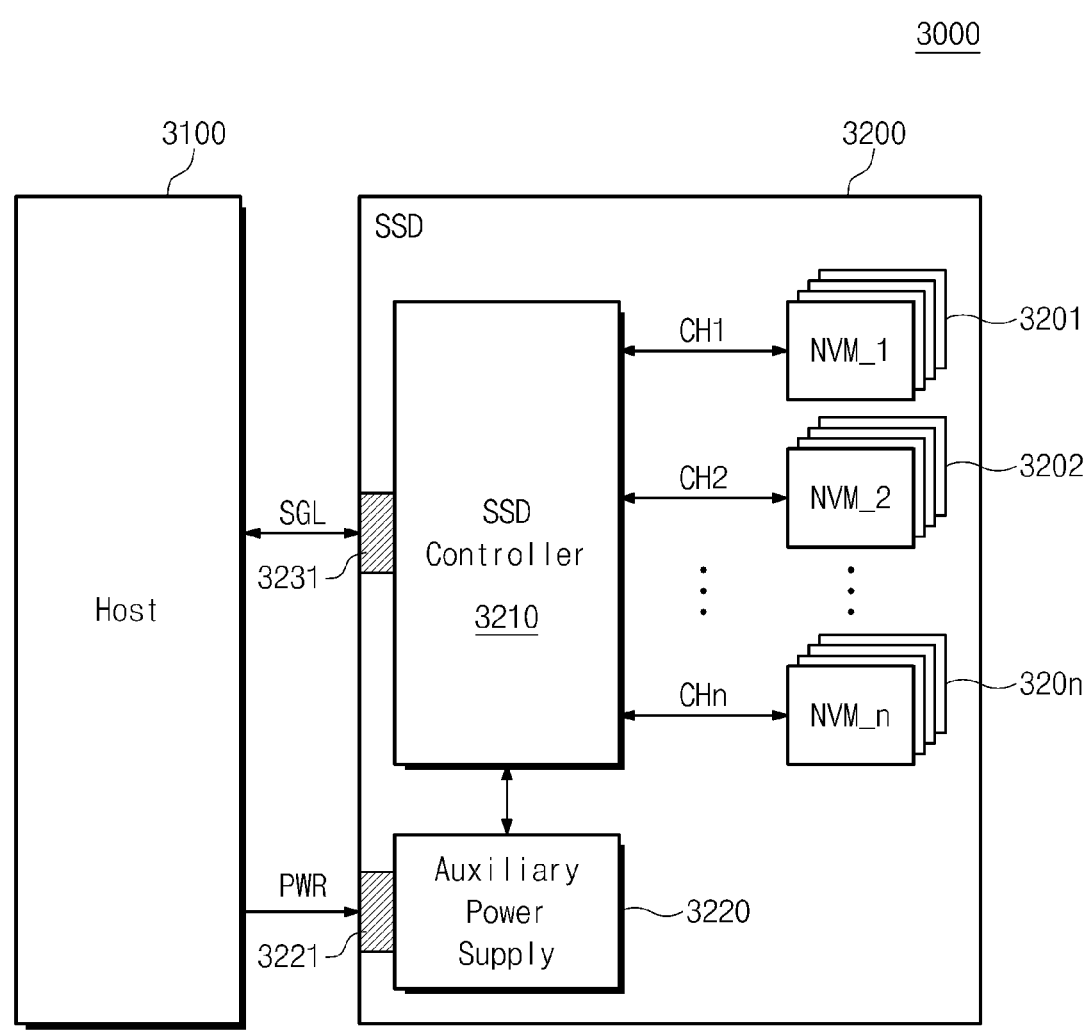
FIG. 10 is a block diagram illustrating an example where a flash memory device in accordance with an embodiment of the inventive concept is embodied by a solid state drive (SSD).

FIG. 10 is a block diagram illustrating an example where a flash memory device in accordance with an embodiment of the inventive concept is embodied by a solid state drive (SSD). Referring to FIG. 10, a SSD system 3000 includes a host 3100 and a SSD 3200. The SSD 3200 exchanges a signal with the host 3100 through a signal connector 3231 and receives a power supply through a power connector 3221. The SSD 3200 includes a plurality of nonvolatile memory devices 3201-320*n*, a SSD controller 3210 and an auxiliary power supply 3220.

The plurality of nonvolatile memory devices 3201-320*n* are used as a storage medium of the SSD 3200. The plurality of nonvolatile memory devices 3201-320*n* can be embodied by a flash memory device having a mass storage capacity. A flash memory is mainly used as the SSD 3200 but besides the flash memory, a nonvolatile memory device such as a PRAM, a MRAM, a MRAM, a ReRAM, a FRAM or the like may be used as SSD 3200.

The plurality of nonvolatile memory devices 3201-320*n* can be connected to the SSD controller 3210 through a plurality of channels CH1-CH*n*. One or more memory devices can be connected to one channel. Memory devices connected to one channel can be connected to the same data bus.

The SSD controller 3210 exchanges a signal with the host 3100 through the signal connector 3231. Here, the signal may include a command, an address, and data. The SSD controller 3210 writes data in a corresponding memory device or reads data from a corresponding memory device. An inner constitution of the SSD controller 3210 will be described in detail with reference to FIG. 10.

The auxiliary power supply 3220 is connected to the host 3100 through the power supply connector 3221. The auxiliary power supply 3220 can charge a power inputted from the host 3100. The auxiliary power supply 3220 can be located inside or outside the SSD 3200. For example, the auxiliary power supply is located at a main board and may provide an auxiliary power supply to the SSD 3200.

The memory system 1000 such as depicted in FIG. 7 can be embodied by the SSD system 3000. The memory system 1000 may include a flash memory device 1100 and a memory controller for controlling the flash memory device 1100. In one embodiment, the flash memory device 1100 is embodied by a plurality of nonvolatile memory devices 3201-320*n* and the memory controller 1200 can be embodied by the SSD controller 3210.

The flash memory device 1100 can perform erasure, writing and read operations according to a control of the memory controller 1200. The flash memory device 1100 changes a voltage applied to a dummy word line DWL according to a select word line when a program operation is performed, as described above, for example, in connection with FIGS. 4-6.

Figure 11:
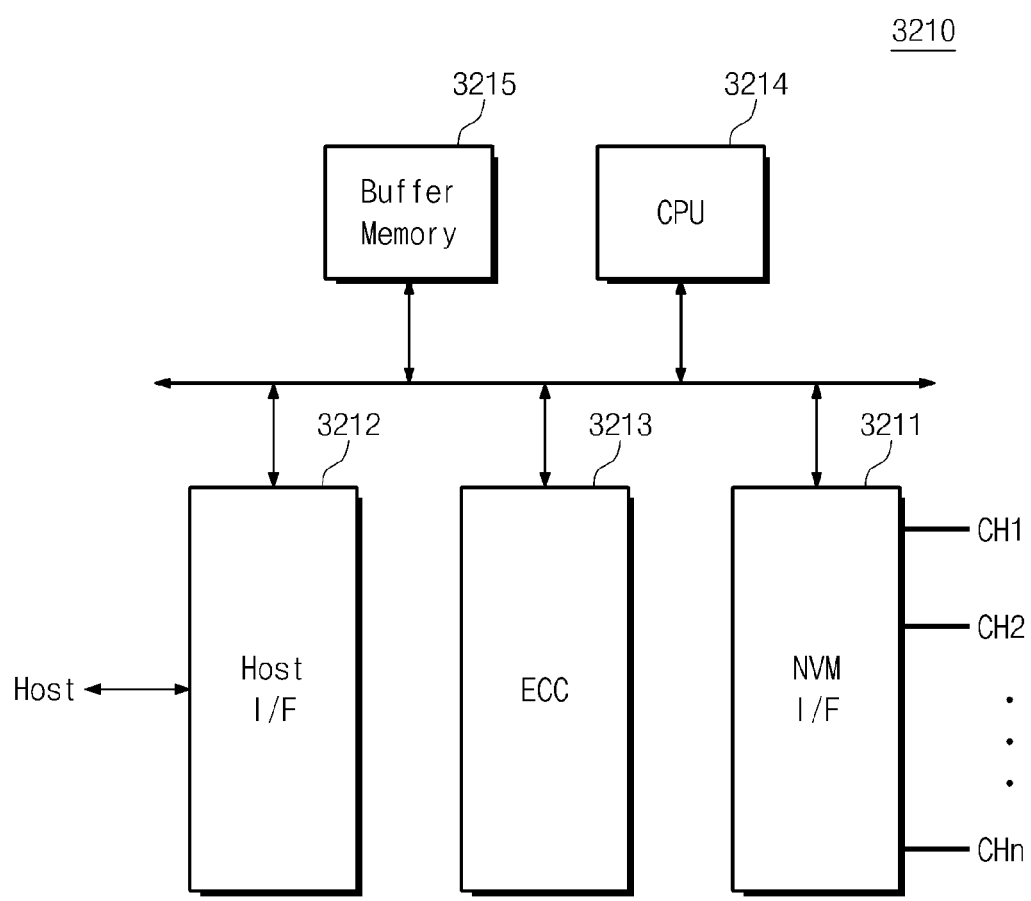
FIG. 11 is a block diagram illustrating an exemplary constitution of the solid state drive (SSD) illustrated in FIG. 10, according to one embodiment.

FIG. 11 is a block diagram illustrating an exemplary constitution of the solid state drive (SSD) controller illustrated in FIG. 10. Referring to FIG. 11, the SSD controller 3210 includes a NVM interface 3211, a host interface 3212, an ECC circuit 3213, a central processing unit (CPU) 3214 and a buffer memory 3215.

The NVM interface 3211 scatters data transferred from the buffer memory 3215 to each of the channels CH1-CH*n*. The NVM interface 3211 transfers data read from the plurality of nonvolatile memory devices 3201-320*n* to the buffer memory 3215. In one embodiment, the NVM interface 3211 can use an interface method of a NAND flash memory. That is, the SSD controller 3210 can perform program, read and erasure operations according to an interface method of a NAND flash memory.

The host interface 3212 provides an interfacing with the SSD 3200 corresponding to a protocol of a host. The host interface 3212 can communicate with the host using a universal serial bus (USB), a small computer system interface (SCSI), a PCI express, an ATA, a parallel ATA (PATA), a serial ATA (SATA), a serial attached SCSI (SAS) and so on. Also, the host interface 3212 can perform a disk emulation function supporting so that the host recognizes the SSD 3200 as a hard disk drive (HDD).

The ECC circuit 3213 generates a parity bit using data transferred to the nonvolatile memories 3201-320*n*. The generated parity bit is stored in a spare area of the nonvolatile memories 3201-320*n*. The ECC circuit 3213 detects an error of data read from the nonvolatile memories 3201-320*n*. If a detected error is in the range of correction, the ECC circuit 3213 corrects the detected error.

The central processing unit (CPU) 3214 analyzes and processes a signal inputted from the host. The central processing unit (CPU) 3214 controls the host or the nonvolatile memories 3201-320*n* through the host interface 3212 or the NVM interface 3211. The central processing unit (CPU) 3214 controls an operation of the nonvolatile memories 3201-320*n* according to a firmware for driving the SSD 3200.

The buffer memory 3215 temporarily stores writing data provided from the host or data read from the nonvolatile memories 3201-320*n*. Also, the buffer memory 3215 can store meta data or cache data to be stored in the nonvolatile memories 3201-320*n*. When a power is suddenly off, meta data or cache data stored in the buffer memory 3215 is stored in the nonvolatile memory devices 3201-320*n*. The buffer memory 3215 can include a DRAM, a SRAM and so on.

Figure 12:
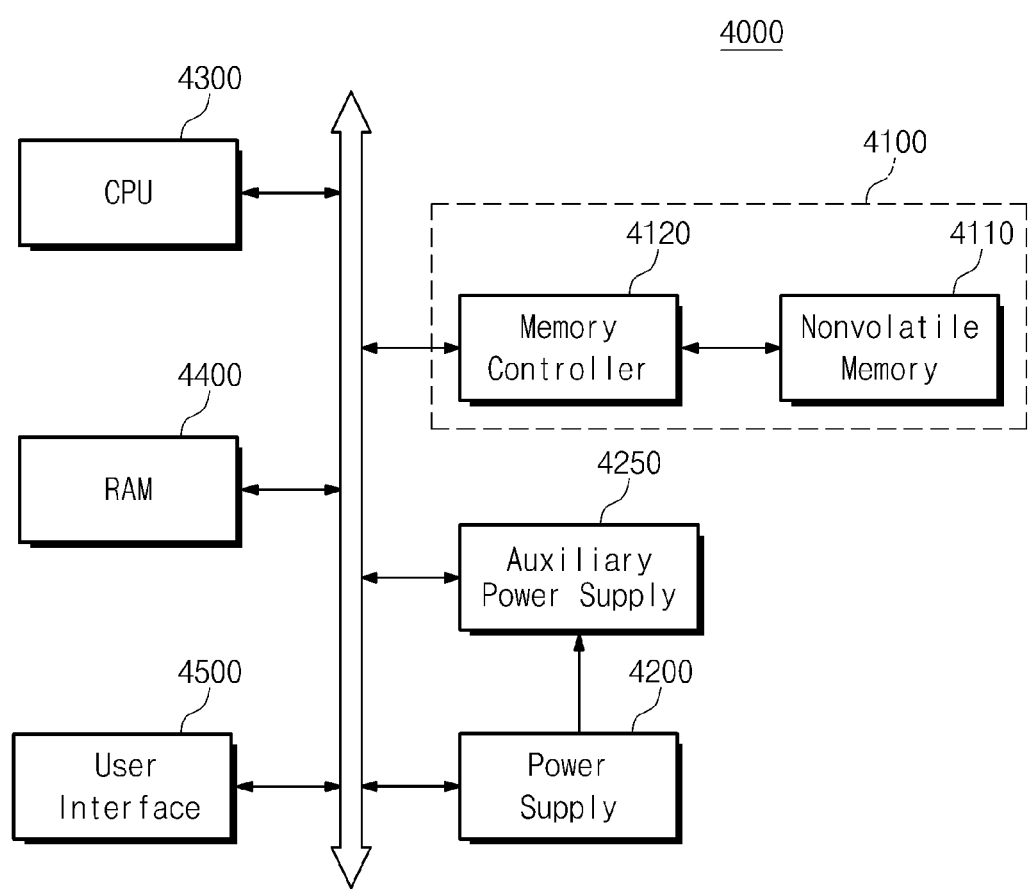
FIG. 12 is a block diagram illustrating an example where a flash memory device in accordance with an embodiment of the inventive concept is embodied by an electronic device.

FIG. 12 is a block diagram illustrating an example where a flash memory device in accordance with an embodiment of the inventive concept is embodied by an electronic device. Here, an electronic device 4000 may be embodied by a personal computer PC or may be embodied by a portable electronic device such as a notebook computer, a cell phone, a personal digital assistant (PDA), a camera, and the like.

Referring to FIG. 12, the electronic device 4000 includes a memory system 4100, a power supply 4200, an auxiliary power supply 4250, a central processing unit (CPU) 4300, a RAM 4400 and a user interface 4500. In one embodiment, the memory system 4100 includes a nonvolatile memory 4110 and a memory controller 4120.

The memory system 1000 described in FIG. 7 in accordance with an embodiment of the inventive concept may be embodied by the memory system 4100 of the electronic device 4000. The memory system 1000 may include a flash memory device 1100 and a memory controller 1200 for controlling the flash memory device 1100. Here, the flash memory device 1100 may be embodied by the nonvolatile memory 4110 of the electronic device 4000 and the memory controller 1200 may be embodied by the memory controller 4120 of the electronic device 4000.

The flash memory device 1100 can perform erasure, writing and read operations according to a control of the memory controller 1200. The flash memory device 1100 changes a voltage applied to a dummy word line DWL according to a select word line when a program operation is performed, as described above, for example, in connection with FIGS. 4-6.

According to a nonvolatile memory device in accordance with an embodiment of the inventive concept and a method of operating the same, when a program operation is performed, a charge loss of a memory cell connected to a word line adjacent to a dummy word line can be reduced by changing a voltage applied to the dummy word line according to a select word line.

The above-disclosed subject matter is to be considered illustrative, and not restrictive, and the appended claims are intended to cover all such modifications, enhancements, and other embodiments, which fall within the true spirit and scope of the inventive concept. Thus, the scope of the inventive concept is to be determined by the broadest permissible interpretation of the following claims and their equivalents, and shall not be restricted or limited by the foregoing detailed description.

What is claimed is:

1. A nonvolatile memory device, comprising:
a string select line;
a ground select line;
a dummy word line adjacent to the ground select line;
a first word line adjacent to the dummy word line; and
a second word line disposed between the string select line and the first word line,
the nonvolatile memory device being configured to apply a voltage to the dummy word line, wherein:
when programming a memory cell connected to the first word line, a first dummy word line voltage lower than a voltage applied to the second word line is applied to the dummy word line, and
when programming a memory cell connected to the second word line, a second dummy word line voltage between a voltage applied to the first word line and the first dummy word line voltage is applied to the dummy word line.

2. The nonvolatile memory device of claim 1, wherein when programming a memory cell connected to the first word line, to prevent a dummy cell connected to the dummy word line from being programmed, a difference between a ground voltage applied to the ground select line and the first dummy word line voltage is maintained below a reference level.

3. The nonvolatile memory device of claim 1, wherein when programming a memory cell connected to the second word line, to limit a reduction of a voltage of the first word line when a pass voltage is applied to the first word line, a difference between the pass voltage and the second dummy word line voltage is maintained below a reference level.

4. The nonvolatile memory device of claim 1, wherein a voltage applied to the second word line when programming a memory cell connected to the first word line has the same level as a voltage applied to the first word line when programming a memory cell connected to the second word line.

5. The nonvolatile memory device of claim 4, wherein the same level is a pass voltage level.

6. The nonvolatile memory device of claim 1, further comprising:
a third word line disposed between the string select line and the second word line, wherein:
when programming a memory cell connected to the third word line, a third dummy word line voltage equal to or greater than the second dummy word line voltage but less than a voltage applied to the second word line is applied to the dummy word line.

7. The nonvolatile memory device of claim 6, wherein:
when programming the memory cell connected to the first word line, the voltage applied to the second word line is a pass voltage;
when programming the memory cell connected to the second word line, the voltage applied to the first word line is the pass voltage; and
when programming the memory cell connected to the third word line, a voltage applied to the first word line and the voltage applied to the second word line are the pass voltage.

8. A nonvolatile memory device, comprising:
a memory cell array including at least a ground select line and a series of consecutive word lines;
the series of consecutive word lines including a dummy word line closest to the ground select line, and first through nth word lines successively further from the ground select line, the first through nth word lines including at least a first through fourth word line;
the nonvolatile memory device configured to apply a voltage to the dummy word line that depends on which of the first through nth word lines are selected, wherein:
when the first word line is selected, a first dummy word line voltage lower than a voltage applied to the second word line is applied to the dummy word line, and
when the second word line is selected, a second dummy word line voltage between a voltage applied to the first word line and the first dummy word line voltage is applied to the dummy word line.

9. The nonvolatile memory device of claim 8, further comprising:
a dummy word line driver connected to the dummy word line and configured to apply the first dummy word line voltage or the second dummy word line voltage to the dummy word line based which of the first through nth word lines are selected.

10. The nonvolatile memory device of claim 9, wherein:
the ground select line is adjacent to the dummy word line;
the first word line is adjacent to the dummy word line; and
wherein when a program operation is performed and a k-th word line among the first through nth word lines is selected while remaining of the first through nth word lines are not selected:

if the k-th word line is the first word line, the first dummy word line voltage is applied to the dummy word line and a pass voltage is applied to the second through nth word lines; and if the k-th word line is the second word line, the second dummy word line voltage is applied to the dummy word line and a pass voltage is applied to the first word line and the third through nth word lines.

11. The nonvolatile memory device of claim 10, wherein:
if the k-th word line is one of the third through nth word lines, a dummy word line voltage having a voltage level equal to or greater than the second dummy word line voltage and less than the pass voltage is applied to the dummy word line.

12. The nonvolatile memory device of claim 8, wherein when the first word line is selected, the first dummy word line voltage is controlled to prevent a dummy cell connected to the dummy word line from being programmed.

13. The nonvolatile memory device of claim 8, wherein when one of the second through nth word lines are selected, a dummy word line voltage is controlled to limit charges accumulated in a memory cell connected to the first word line from being reduced.

14. The nonvolatile memory device of claim 8, wherein:
the nonvolatile memory device is a NAND type flash memory device.

15. A method of operating a nonvolatile memory device, comprising:
determining whether or not a first word line adjacent a dummy word line is selected for a program operation;
applying to the dummy word line, if the first word line is selected for the program operation, a first dummy word line voltage lower than a pass voltage; and
applying to the dummy word line, if a second word line not adjacent to the dummy word line is selected for a program operation, a second dummy word line voltage between the pass voltage and the first dummy word line voltage.

16. The method of claim 15, further comprising:
applying to the dummy word line, if a third word line further from the first word line than the second word line is selected for a program operation, a third dummy word line voltage between the pass voltage and the second dummy word line voltage.

17. The method of claim 15, wherein the dummy word line, first word line, and second word line are part of a memory cell array that includes the first word line through an nth word line, n being at least four, and further comprising:
applying the pass voltage to all unselected word lines of the first through nth word lines while applying a dummy word line voltage to the dummy word line; and
applying a program voltage higher than the pass voltage to the selected word line among the first through nth word lines.

18. The method of claim 15, wherein the first dummy word line voltage is applied to the dummy word line to maintain a difference between the first dummy word line voltage and a ground voltage below a reference voltage.

19. The method of claim 15, wherein the second dummy word line voltage is applied to the dummy word line to maintain a difference between the second dummy word line voltage and the pass voltage below a reference voltage.

20. The method of claim 15, wherein the nonvolatile memory device is a NAND type flash memory device.

* * * * *